United States Patent [19]

Durand et al.

[11] 4,199,729

[45] Apr. 22, 1980

[54] VARIABLE PEAK DETECTOR

[75] Inventors: Jean-Michel Durand, Le Kremlin Bicetre; Etienne Penicaud, Chaville, both of France

[73] Assignee: Compagnie Industrielle des Telecommunications Cit-Alcatel, Paris, France

[21] Appl. No.: 837,147

[22] Filed: Sep. 27, 1977

Related U.S. Application Data

[63] Continuation of Ser. No. 667,958, Mar. 17, 1976, abandoned.

[30] Foreign Application Priority Data

Mar. 20, 1975 [FR] France ........................ 75 08763

[51] Int. Cl.² .................. H03K 5/153; H03K 5/20
[52] U.S. Cl. ........................ 328/151; 307/351; 328/116
[58] Field of Search ............ 328/115, 116, 117, 135, 328/146, 147, 150, 151; 307/235 R, 235 A, 235 B, 235 C, 235 J, 235 K, 235 P; 178/7.3 DC, 7.3 S; 179/15 AS, 1 F; 325/400, 402

[56] References Cited

U.S. PATENT DOCUMENTS

| | | | |
|---|---|---|---|
| 3,699,256 | 10/1972 | Roth | 178/7.3 S |
| 3,952,166 | 4/1976 | Kato et al. | 179/170.8 |
| 4,044,311 | 8/1977 | Kashioka et al. | 328/116 |
| 4,053,840 | 10/1977 | Barth | 328/115 |

*Primary Examiner*—John Zazworsky
*Attorney, Agent, or Firm*—Haseltine, Lake & Waters

[57] ABSTRACT

A signal peak detector which can be used for echo suppressors, has a memory in which is written a value which is variable as a function of the incident signal and represents the peak sought, an attenuator of the memorized value; four comparators; three of which compare the instantaneous value of the incident signal with, respectively the memorized value, the attenuated memorized value and a fixed threshold, and the fourth of which compares the attenuated memorized value with the fixed threshold; and a control unit which modifies the memorized value as a function of the result of those comparisons.

4 Claims, 2 Drawing Figures

VARIABLE PEAK DETECTOR

This is a continuation of application Ser. No. 667,958, filed Mar. 17, 1976, now abandoned.

BACKGROUND OF THE INVENTION

The invention concerns a peak detector of a variable incoming signal and includes, a memory, a first comparator for comparing a representation of the instantaneous value of the variable incoming signal with a value stored in the memory and a control unit for changing the memorized value. Such a detector can be used anywhere when it is required to supervise the operating of a transmission channel, whether the signal be analog or digital. A particular application is found for the detector in the branch of a four-wire telephone transmission system, in which the state of a circuit must be known at each instant in order to be able to cancel the echoes or block the transmission of noises when the subscriber is not speaking, these operations, moreover, requiring, generally, a comparison between the level of the signals on the transmitting and receiving channels of a subscriber.

To know the level of a signal, an integrating of that signal is generally performed and a comparison of the ingegrated value with a fixed threshold enables the distinguishing of the useful signal from the noise. If the processing of an analog signal according to this principle does not create any major problem, it will be observed that the integration of a variable which is represented digitally leads to complicated and expensive devices as shown for example in U.S. Pat. No. 3,825,694 of issued July 23, 1974.

Another solution to the problem, which is better suited to the needs of a digital echo suppressor, is described in U.S. Pat. No. 3,896,273.

The integration is substituted, therein, by a detection of digital levels and a comparison of those levels with a threshold. Each threshold is valid during 50 ms time interval and all the values of the amplitude of the incident signal and stored during the original interval of 50 ms in memory cells. After the passing of those 50 ms, the threshold is replaced by the highest value which had been found in that period.

Such a device, although it is not as expensive as a real integrator, nevertheless requires a high-capacity-memory to store a great number of distinct values and comparators having a great number of inputs.

Furthermore, another circuit, in which the instantaneous value of an incident signal to be processed, in digital form, is compared with a variable threshold stored in a memory, is also known. When the instantaneous value of the incident signal is greater than the threshold, or when the threshold has not been modified during a predetermined period, the instantaneous value becomes the new threshold.

Such a circuit, which is very simple, does not alone, satisfactorily solve the integration problem in the case of an echo suppressor and another circuit, establishing, on the basis of the thresholds memorized successively and according to a predetermined law, values representing the envelope of the incident signal is required. Nevertheless, the combination of those two circuits, on the one hand, is fairly complex and on the other hand, forms a fairly slow system which can cause delays in the cancelling of echoes.

SUMMARY OF THE INVENTION

The invention has as an object overcoming the aforementioned disadvantages and contemplates a peak detector of a variable comprising a memory, a first comparator for comparing the instantaneous value of the variable with a value recorded in the memory and a control unit for controlling the changes in the recorded value. The detector according to the invention is characterized in that it comprises an attenuating circuit sending out a value equal to the recorded value which is attenuated in a pedetermined fixed proportion, a second comparator and a third comparator for comparing the instantaneous value of the variable respectively with a predetermined fixed threshold and with the attenuated recorded value and a fourth comparator for comparing that attenuated recorded value with the threshold and wherein the control unit modifies the recorded value as a function of the outputs of the comparators in such a way that:

when the instantaneous value is greater than or equal to the fixed threshold, the recorded value is replaced by the instantaneous value if that latter value is greater than it and if the recorded value has not changed for a first predetermined period it is replaced either by the instantaneous value is the latter is greater than or equal to the attenuated recorded value, or in the contrary case, that latter value and when the instantaneous value is smaller than the fixed threshold, if that condition is fulfilled during a period of time which is less than a second predetermined period and when the contents of the memory has not changed since the first predetermined period, the new value recorded in the memory is either the attenuated recorded value if the latter is greater than or equal to the threshold, or, in the contrary case, a fixed value which is, at the most, equal to the threshold, and if the instantaneous value is less than the threshold during the said second predetermined period, the new value written in the memory is a fixed value which is, at the most, equal to the threshold. Such recorded value is the desired peak.

The mathematical expression "variable" has been chosen hereinabove to show that the invention is not limited to a certain physical form of representation. It can, indeed, be applied to an analog signal whose amplitude, frequency or phase comprises the data whose peak is to be detected, but it applies also and, it may be said, more particularly, to a digital representation of a variable in which a value is indicated by a group of bits, that group being called a "word" and representing in binary code, the value of a sample of an analog signal. In such an application, the memory, as well as the comparator, is, preferably also made in digital form and each of the predetermined periods is measured by a counter fed by a sampling clock.

DESCRIPTION OF THE DRAWINGS

The invention is described hereinafter in greater detail with reference to an example of embodiment and to two figures.

DESCRIPTION OF THE PREFERRED EMBODIMENT

Figure 1:
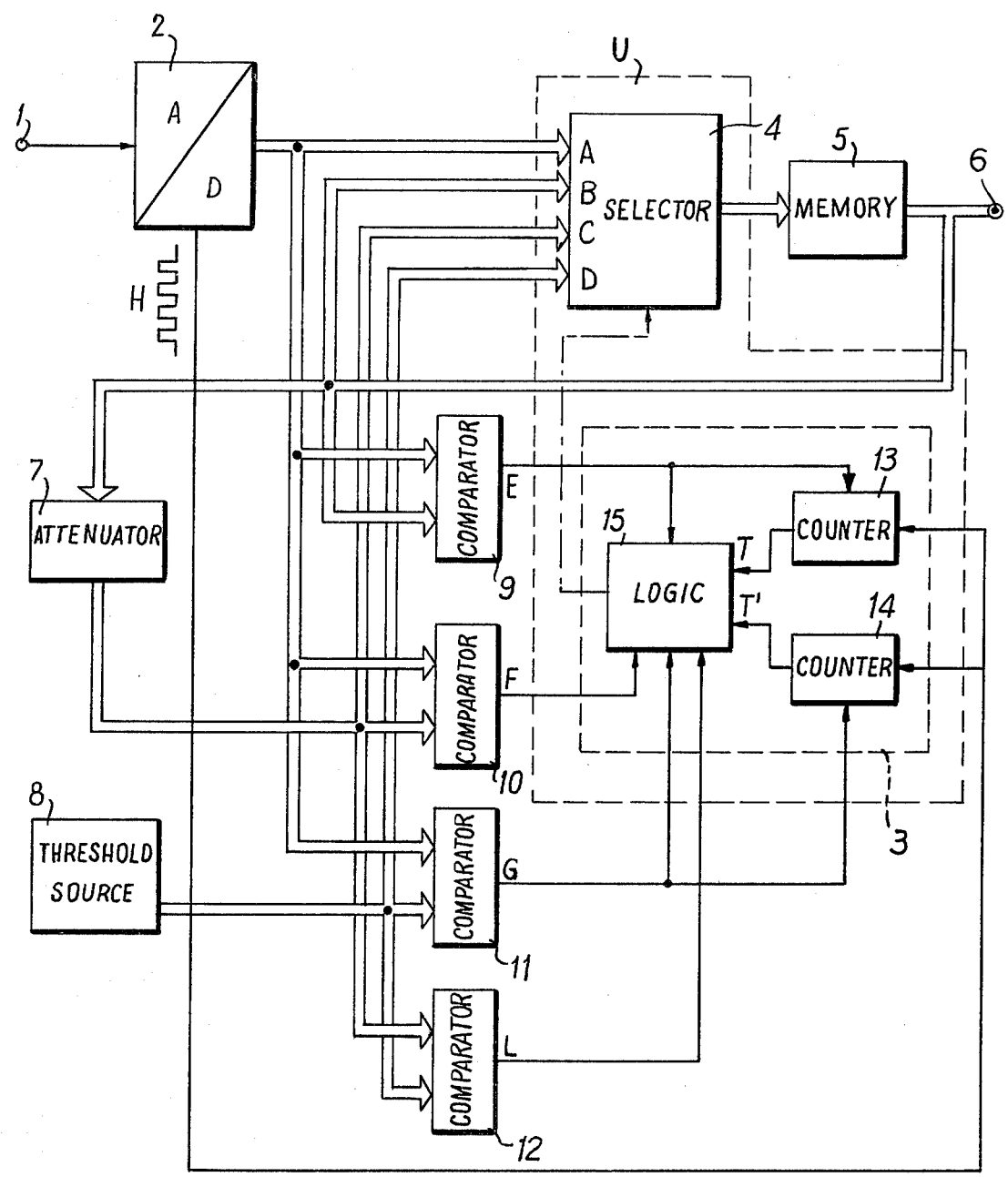
FIG. 1 shows diagrammatically a detector according to the invention.

An input 1 receives an analog signal whose amplitude peak is to be detected. That signal is applied to an analog-to-digital converter 2 having a plurality of outputs for a multibit digital word and supplying, at a regular frequency and in parallel, the various bits of the digital work of a sample of the incident signal. The regular rate of the conversions is obtained either by a clock incorporated in that converter or by an outside clock. The pulses of the clock (not shown) designated hereinafter by H are used also in unit U for controlling a memory 5 whose output is connected to an output 6 of the detector. The unit U comprises a selector 4, connected to the input of the memory 5 and a control assembly 3 defining the operation. The selector 4 can be an electronic equivalent of a ganged switch having a plurality of inputs and a common output to all inputs hereinafter called a selector output. Such switches or selectors are called multiplexers.

The selector 4 has four inputs A, B, C and D and has one of them at a time connected to memory 5 via the selector output.

The inputs A and B are connected to the respective outputs of the converter 2 and of the memory 5. The input C is fed by the output of the memory 5 through a circuit 7 whose function is to attenuate the value recorded in the memory in a predetermined fixed ratio. The input D is fed by a source 8 having a fixed value called, hereinafter, the threshold.

The detector further comprises moreover, four comparators 9, 10, 11 and 12. The first three of these comparators 9, 10 and 11 compare the word coming from the converter 2 with, respectively, the word stored in the memory 5, the value determined by the attenuating circuit 7 and the threshold coming from the source 8. Each of the respective outputs, F and G, of the comparators 10 and 11 transmits to the control assembly 3 a binary signal which is at ONE when the value coming from the converter 2 is greater than or equal to the corresponding comparison value and at ZERO in the contrary case. The output E, of the comparator 9 applies a ONE to that assembly when the value coming from the converter 2 is greater than the recorded value and a ZERO in the contrary case.

The comparator 12 compares the recorded value attenuated by the circuit 7, with the threshold coming from the source 8 and transmits to the control assembly 3, through its outputs L, a binary signal which is at ZERO or at ONE, according to whether the attenuated value is or is not lower than the threshold.

The control assembly 3 comprises a logic element 15 as well as two counters 13 and 14 counting the clock pulses H and connected respectively to the outputs E and G of the comparators 9 and 11.

The counter 13 has a counting capacity defining a first predetermined period. At the end of each counting cycle, it returns to zero to begin again a new cycle. Moreover, each time the output E is at ONE, the cycle being effected is interrupted and the counter 13 is reset to zero. That counter applies to the logic element 15 a binary signal T which is at ONE to indicate the end of a complete counting cycle, at ZERO otherwise.

The counter 14 has a counting capacity defining a second predetermined period d'. That counter is connected to the output G in such a way that when a ZERO level is maintained a that output, it counts the pulses of the clock H until it reaches, contingently, its full capacity, in which case, it remains blocked on its maximum value if the level changes to ONE at the output G, it is brought back to the value zero and remains blocked at that latter value as long as the level at the output G is at ONE. The counter 14 applies to the logic element 15 a binary signal T' which is at ZERO to show that this counter is at its full capacity, and at ONE otherwise.

The logic element 15 is connected to the outputs E, F, G and L of the comparators 9, 10, 11 and 12 respectively. Taking the data at these outputs, as well as the signals T and T' as a basis, that logic element provides the control of the selector 4. No detailed description will be given of the logic element 15, which is formed by means of simple logic gates, the description of the latter is given by a set of Boolean equations as follows:

the input A is connected to the selector output of the selector and where G being at ONE, E is at ONE or F and T are simultaneously at ONE, that is, when the following condition is met:

$$G.(E+F.T.)=1$$

the input B of the selector 4 is connected to the selector output when, simultaneously T' is at ONE and E and T are at ZERO, that is, when the following condition is met:

$$T.\overline{E}.\overline{T'}=1$$

the input C of the selector 4 is connected to the selector output when, simultaneously T', T and L are at ONE and F is at ZERO, that is, when following condition is met:

$$T.T'.L.\overline{F}=1$$

the input D of the selector is connected to the selector output when T' is at ZERO or when, T being at ONE, simultaneously G is at ZERO and F is at ONE, or, simultaneously, F and L are at ZERO, that is, when the following condition is met:

$$\overline{T'}+T.(\overline{G}.F+\overline{F}.\overline{L})=1.$$

Each one of these operations generates a unique signal which is fed via a different lead in the cable connecting the logic unit 15 to the selector 4.

Figure 2:
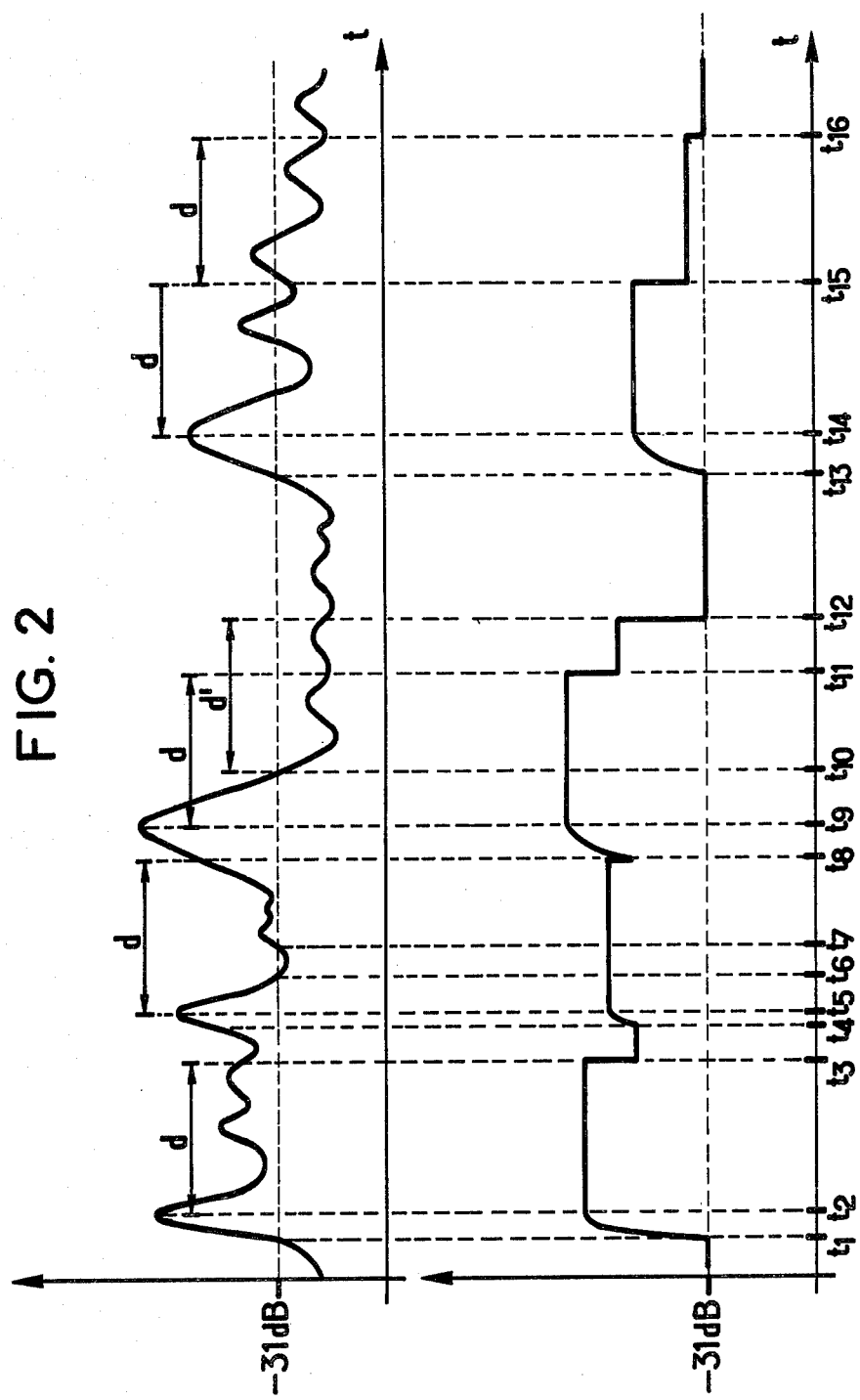
FIG. 2 shows two diagrams which explain the operation of that detector.

The operating mode of the detector described above is explained hereinafter by means of FIG. 2. The top diagram of that Figure shows, by way of an example, an analog variable and the bottom diagram shows the signal obtained at the output 6 after a reconversion to the analog form. The analog variable can be the power on a telephonic channel. The peaks which are ascribed to the noise of the channel are normally lower than −31 dB, whereas the peaks ascribed to a useful signal exceed that threshold. Furthermore, the attenuating circuit applies to the value leaving the memory, an attenuation of 6 dB, for example. By way of illustration, the predetermined periods d and d', that is, the respective periods of the counting cycles of the counters, can both be 50 ms.

Let it be assumed that originally the binary value for the threshold of −31 dB is recorded in the memory 5, the counter 14 is locked at its maximum value and this signal T' is at ZERO. It will be observed as that soon as the signal according to the first waveform in FIG. 2 exceeds that threshold, the selector 4 connects the input A to the memory and the value originally recorded is replaced by the incident value. At each change in the value written in the memory the counter 13 is reset to zero and the counter 14, reset to zero at the time when the threshold was first exceeded, remains locked at that value and the signal T' is at ONE. Assuming that ten samples of the signal are taken from the rising side up to the peak, the memory changes contents ten times, to register, finally, the value of the peak at the instant t2. The following sample, whose value is therefore lower than the contents of the memory, makes the output E of the comparator 9 change and consequently makes the state of the selector 4 change by connecting the selector output to the input B. The signal shown remaining higher than the threshold, the counter 14 remains locked at zero, maintaining the signal T' at ONE. The counter 13 is no longer reset to zero and therefore continues its counting cycle.

In the example chosed, that cycle continues completely until the instant t3 without the incident signal again reaching the peak level at the instant t2, nor falling lower than the threshold. The counter 13 then sends out a signal T at the level ONE, this making the output of the selector 4 change to intput A, to input C or to input D, as a function of the respective outputs F, G and L of the comparators 10, 11 and 12, and the counter 13 returns to its initial state. In the example chosen, output F being at ZERO and G and l being at ONE, the selector output of selector 4 is connected to the input C. It is therefore observed that the memory receives the value which it contained previously, attenuated by 6 dB.

A short time after, at the instant t4, the incident signal exceeds that threshold and the process of the rising of the stored value begins again to reach, at the instant t5, a new peak. The period between t5 and t8 corresponds to a complete cycle of the counter 13 and the value of the preceding peak is replaced, in the memory, by the instantaneous value of the signal which, in the example chosen, is greater than −31 dB and than the stored value attenuated by 6 dB.

During that period between t5 and t8, the incident signal falls below −31 dB at the instant t6 the counter 14 beings counting cycle, but the latter is interrupted a short time after and the counter 14 is reset to zero, at the instant t7, when the incident signal again becomes greater than −31 dB, and that short incursion of the incident signal below the threshold value has no influence on the stored value.

From the instant t8, the value in the memory rises soon after, in accordance with the incident signal, to a new peak which is maintained between the instants t9 and t11, during the predetermined period of time d corresponding to the counting cycle of the counter 13. During that time, the incident signal decreases and, at the instant t10, falls below the threshold value, causing the starting of a counting cycle of the counter 14. The signal chosen then has a fairly long period of noise at low amplitude (less than −31 dB) and the decrease in the value in the memory is effected in two phases: at the instant t11, the decrease is 6 dB and the new stored value remains higher than −31 dB, at the instant t12, separated from the instant t10 by the period d', the counter 14, reaching the end of the cycle, sets the binary signal T to ZERO causing the writing of the threshold value in the memory.

After that noise period, the incident signal again exceeds −31 dB at the instant t13 and the counter 13 is reset to zero, as is the counter 14. The value in the memory follows the rise of the incident signal to reach a new peak at the instant t14. That signal then effects incursions below the threshold which are, however, insufficiently long to allow the completion of the counting cycle of the counter 14. At the instant t15, separated by a period of time d from the instant t14, the selector output of the selector 4 changes to the input C, the instantaneous value of the variable being less than the last peak value attenuated by 6 dB, that attenuated value itself being higher than the threshold. The signal chosen remains at a low amplitude and after a further period of time d, during which the attenuated value is maintained in the memory, the threshold value is stored at the instant t16.

It is evident that the invention is not Limited to the example of embodiment described in detail hereinabove. More particularly, without going beyond the scope of the invention, it is possible to modify the technology of the memory, as well as that of the selector. On the other hand, it is not necessary for the value of the threshold to be written in the memory during the noise periods, it being possible to store any fixed value lower than or equal to that threshold. In the case where the input variable is already in digital form, the converter 2 is superfluous. The invention can also be made entirely in analog form, choosing, for the memory 5 and the comparator, analog components. An application can be found for the detector in the field of telephony as well as in other fields where the presence and the level of a useful signal must be detected despite the presence of noise.

We claim:

1. Apparatus for detecting the peak value of a variable comprising:
   a memory for storing a value; a first comparator means for comparing the instantaneous value of the variable with a value stored in said memory; an attenuting means for transmitting an attenuated value equal to the stored value attenuated by a predetermined fixed ratio; a second comparator means for comparing the instantaneous value of the variable with said attenuated value; a third comparator means for comparing the instantaneous value of the variable with a predetermined fixed threshold value; a fourth comparator means for comparing said attenuated value with said threshold value; and a control means for modifying the value stored in said memory as a function of the outputs of all of said comparator means, said control means comprising a control assemblage means connected to the outputs of all of said comparator means and a switching means having a first input adapted to receive the instantaneous value of the variable, a second input connected to said attenuating means for receiving said attenuated value and a third input adapted to receive a fixed value which has a maximum value equal to said threshold value, for replacing said stored value by one of these three received values under the control of said control assemblage means such that:
   the stored value is replaced by the instantaneous value of the variable in each of the two following first cases:
   (1) when, simultaneously, the instantaneous value of the variable is greater than or equal to said threshold value and greater than said stored value; and (2) when, simultaneously, said stored value has remained unchanged for a first predetermined period of time and the instantaneous value of the variable is greater than or equal to said fixed threshold value and greater than or equal to said attenuated value:

said stored value is replaced by said attenuated value in each of the two following second cases:

(1) when, simultaneously, said stored value has remained unchanged for said first predetermined period of time, said attenuated value is greater than the instantaneous value of the variable, and instantaneous value of the variable is greater than or equal to said fixed threshold value; and (2) when, simultaneously, the stored value has remained unchanged for said first predetermined period of time, said attenuated value is greater than or equal to said fixed threshold value, and the instantaneous value of the variable is smaller than said fixed threshold value, provided the instantaneous value of the variable has remained smaller than said fixed threshold value for less than a second predetermined period of time; and said stored value is replaced by a fixed value which has a maximum equal to said fixed threshold value, in each of the two following third cases:

(1) when, simultaneously, said stored value has remained unchanged for said first predetermined period of time, said attenuated value is smaller than said fixed threshold value, and the instantaneous value of the variable is smaller than said fixed threshold value, and (2) when the instantaneous value of the variable has remained smaller than said fixed threshold value for said second predetermined period of time; the stored value constituting the peak detected.

2. Apparatus according to claim 1 wherein the variable is in the form of an analog signal, said apparatus further comprising an analog to digital converter means receiving the analog signal for applying binary words to said control assemblage means and to said first, second and third comparator means representing samples of the analog signal, and said stored value, said attenuated value and said fixed threshold value also being in the form of binary words.

3. Apparatus according to claim 2 further comprising means for generating clock pulses, a first counter of the clock pulses defining by a first predetermined state corresponding to the end of a counting cycle said first predetermined period, said first counter returning to its counting origin on the one hand, after each pass through that predetermined state and on the other hand, each time the instantaneous value of the variable replaced the stored value, and a second counter of the clock pulses arriving at a predetermined state corresponding to the end of a counting cycle and defining said second predetermined period, means repsonsive to said second comparator means for blocking said second counter when the instantaneous value of the variable is greater than or equal to the said fixed threshold value, said second counter beginning a new counting cycle each time that instantaneous value becomes lower than said fixed threshold value, means for maintaining said second predetermined state when reached as long as the instantaneous value of the variable remains lower than said fixed threshold value.

4. Apparatus for detecting the peak value of a variable comprising:

generating means for generating representations of the value of the variable;

memory means for storing a representation of a value;

attenuating means connected to said memory means for generating an attenuated representation of the representation stored in the memory means;

threshold means for generating the representation of a threshold value;

first comparator means for comparing a representation generating by said generating means with the representation stored by said memory means;

second comparator means for comparing a representation generated by said generating means with the attenuated representation generated by said attenuating means;

third comparator means for comparing a representation generated by said generating means with the representation generated by said threshold means;

fourth comparator means for comparing the representation generated by said threshold means with the attenuated representation generated by said attenuating means;

a selector means having a first input connected to said generating means for receiving representations therefrom, a second input connected to said attenuating means for receiving representations therefrom, a third input connected to said threshold means for receiving representation therefrom, an output connected to said memory means for transmitting representations thereto, means responsive to first, second and third signals for respectively connecting said first, second and third inputs to said output; and logic means for generating said first, second and third signals, said logic means including first means for generating said first signal when, simultaneously, the representation generated by said generating means is greater than or equal to the representation generated by threshold means and greater than the representation stored in said memory means, or when, simultaneously, the representation stored in said memory means has remained unchanged for a first predetermined period of time and the representation generated by said generating means is greater than or equal to the representation generated by said threshold means and greater than or equal to the representation generated by said attenuating means, second means for generating said second signal when, simultaneously, the representation stored in said memory means remained unchanged for said first predetermined period of time, the representation generated by said attenuating means is greather than the representation generated by said generating means and the representation generating by said generating means is greather than or equal to the representation generated by said threshold, or when, simultaneously, the representation stored in said memory means has remained unchanged for said first predetermined representation period of time, the representation generating by said attenuation means is greater than or equal to the representation generated by said threshold means, and the representation generating by said generating means is smaller than the representation generated by said fixed threshold means, provided the representation generated by said generating means has remained smaller than the representation generated by said threshold means for less than a second predetermined period of time, and third means for generating said third signal when, simultaneously, the representation stored in said memory means has remained unchanged for said first predetermined period of time, the representation generated by said attenuating means is smaller than the representation generated by said threshold means, and the representation generated by said generating means is smaller than the representation generated by said threshold means, or when the representation generated by said generating means has remained smaller than the representation generated by said threshold means for said second predetermined period of time;

the representation stored in said memory means constituting the peak detected.

* * * * *